(12) United States Patent
Park et al.

(10) Patent No.: US 12,538,417 B2
(45) Date of Patent: Jan. 27, 2026

(54) ELECTRONIC SUBSTRATE

(71) Applicant: LG INNOTEK CO., LTD., Seoul (KR)

(72) Inventors: Heun Park, Seoul (KR); Kab Young Kim, Seoul (KR); Sang Young Lee, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 208 days.

(21) Appl. No.: 18/278,967

(22) PCT Filed: Feb. 25, 2022

(86) PCT No.: PCT/KR2022/002763
§ 371 (c)(1),
(2) Date: Aug. 25, 2023

(87) PCT Pub. No.: WO2022/182186
PCT Pub. Date: Sep. 1, 2022

(65) Prior Publication Data
US 2024/0138058 A1  Apr. 25, 2024
US 2024/0237199 A9  Jul. 11, 2024

(30) Foreign Application Priority Data

Feb. 26, 2021 (KR) .......... 10-2021-0026518

(51) Int. Cl.
*H05K 1/02* (2006.01)
*H05K 1/03* (2006.01)
(Continued)

(52) U.S. Cl.
CPC .......... *H05K 1/0283* (2013.01); *H05K 1/036* (2013.01); *H05K 1/0393* (2013.01); *H05K 1/111* (2013.01); *H05K 1/115* (2013.01); *H05K 1/189* (2013.01); *H05K 2201/10015* (2013.01); *H05K 2201/10022* (2013.01); *H05K 2201/1003* (2013.01);
(Continued)

(58) Field of Classification Search
CPC .......................... H05K 1/0278; H05K 1/028
See application file for complete search history.

(56) References Cited

U.S. PATENT DOCUMENTS 10,123,424 B1 * 11/2018 Lee .............. H05K 1/181
2014/0124737 A1   5/2014 Takei et al.
(Continued)

FOREIGN PATENT DOCUMENTS

KR  10-2016-0020034 A  2/2016
KR  10-2020-0124461 A  11/2020
KR  10-2021-0018011 A  2/2021

*Primary Examiner* — Jeremy C Norris
(74) *Attorney, Agent, or Firm* — Birch, Stewart, Kolasch & Birch, LLP

(57) ABSTRACT

According to one embodiment of the present invention, an electronic substrate includes a base including a first surface and a second surface that is a surface opposite to the first surface, an electronic component disposed on the second surface of the base, and a line disposed on the second surface of the base and connected to the electronic component, wherein the base includes a frame region including a flexible material and a plurality of opening regions passing between the first surface and the second surface, and the electronic component and the line are disposed in the frame region.

18 Claims, 5 Drawing Sheets

(51) Int. Cl.
*H05K 1/11* (2006.01)
*H05K 1/18* (2006.01)

(52) U.S. Cl.
CPC .............. *H05K 2201/10037* (2013.01); *H05K 2201/10098* (2013.01); *H05K 2201/10151* (2013.01); *H05K 2201/10166* (2013.01); *H05K 2201/10174* (2013.01)

(56) References Cited

U.S. PATENT DOCUMENTS

| | | | |
|---|---|---|---|
| 2015/0282294 A1 | 10/2015 | Wakuda et al. | |
| 2016/0363723 A1* | 12/2016 | Choi | G02B 6/0091 |
| 2020/0253043 A1 | 8/2020 | Dardona et al. | |

* cited by examiner

[Fig. 1]
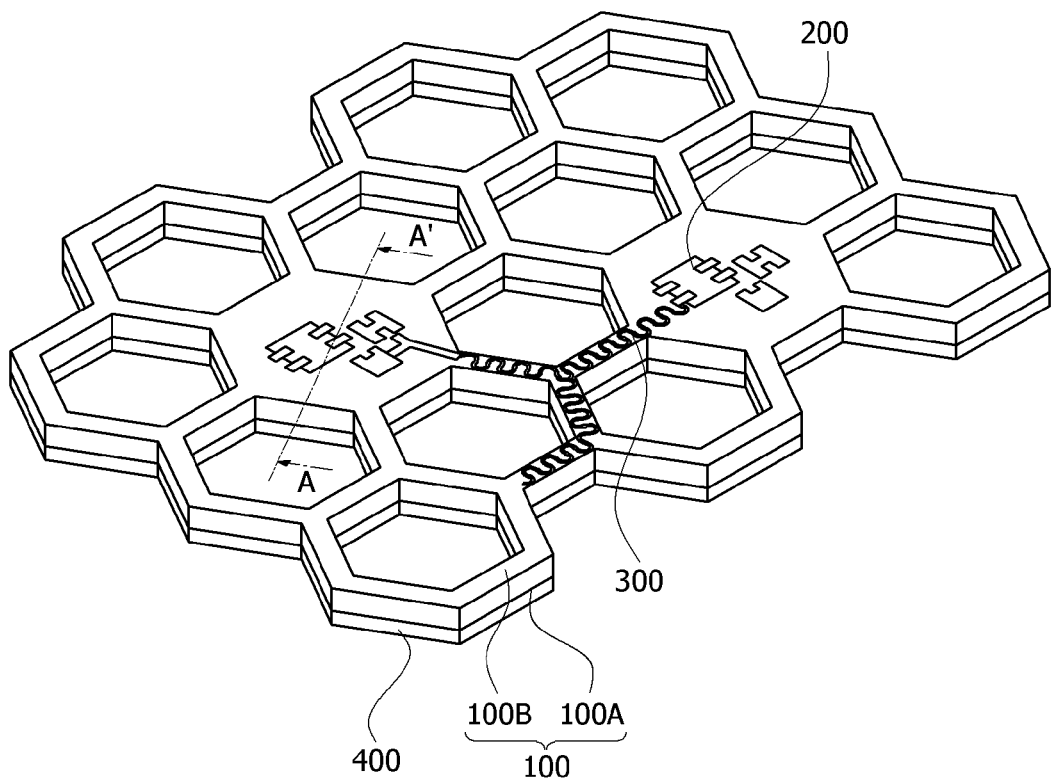
[Fig. 2]
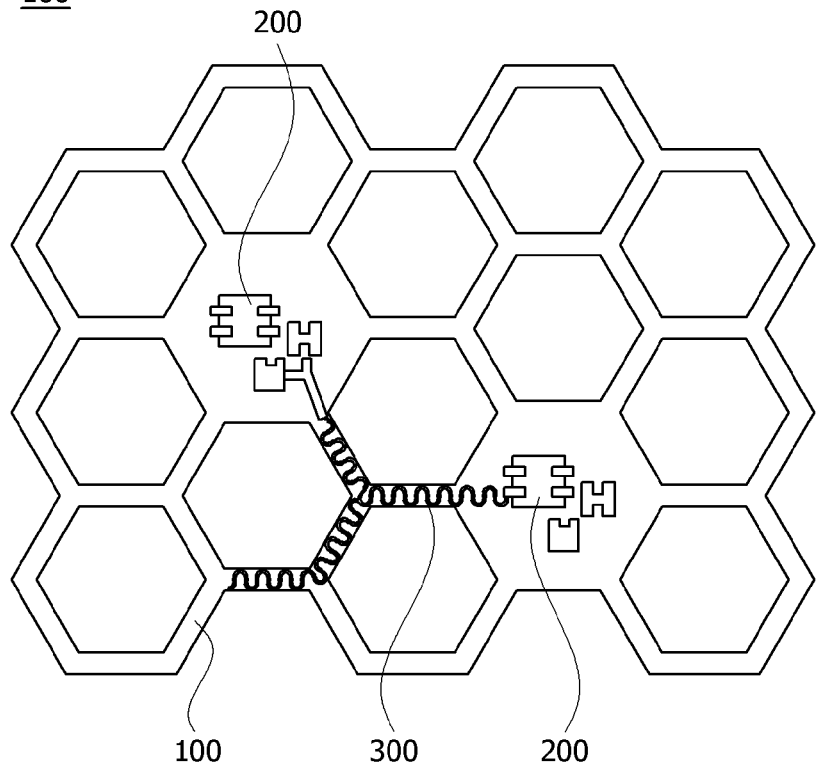

[Fig. 3]
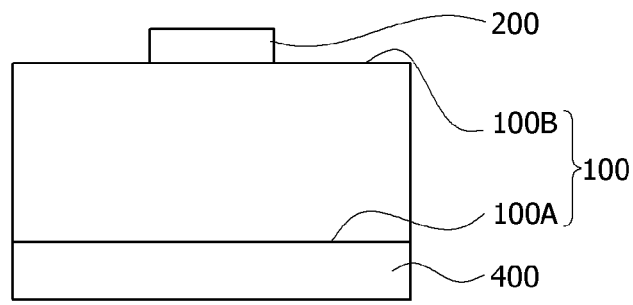
[Fig. 4]
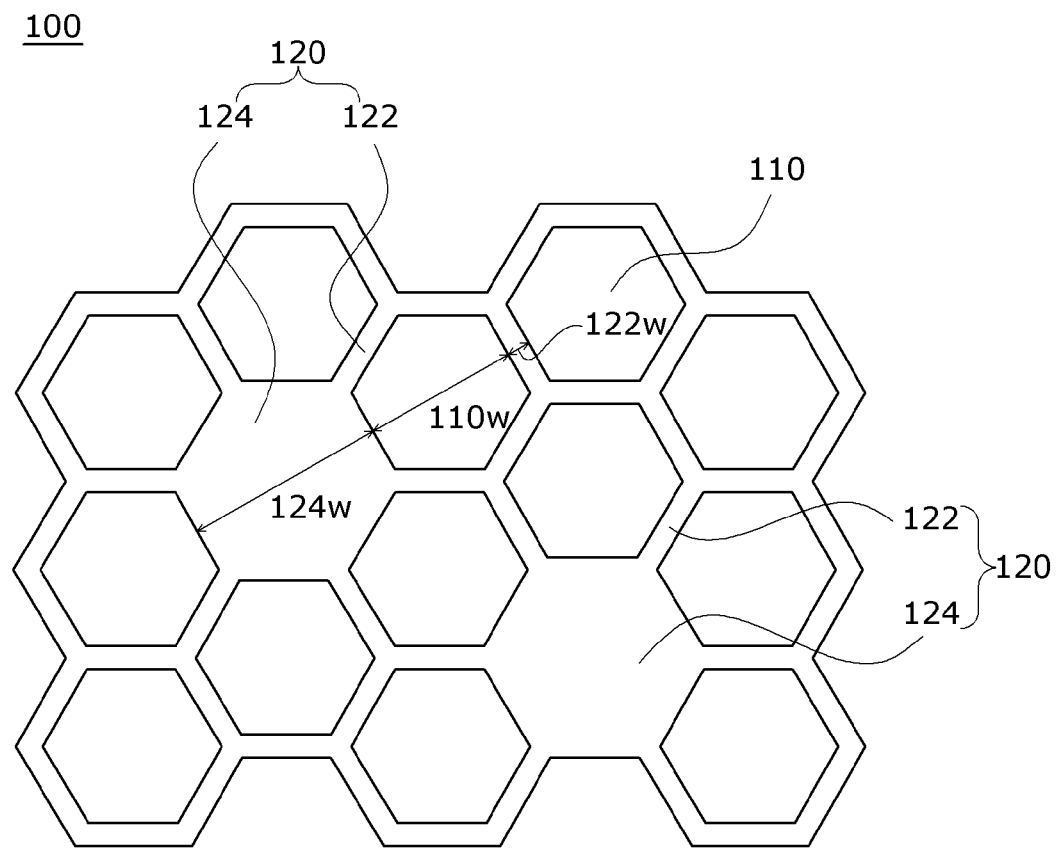

[Fig. 5]
(a)
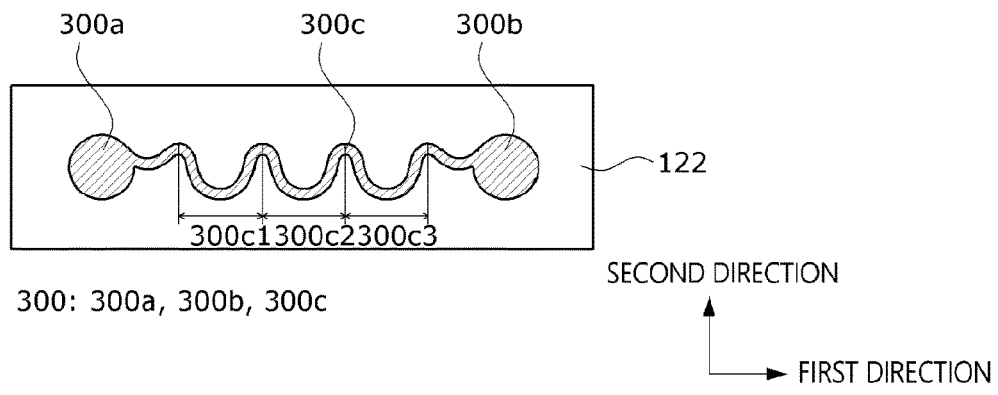
(b)
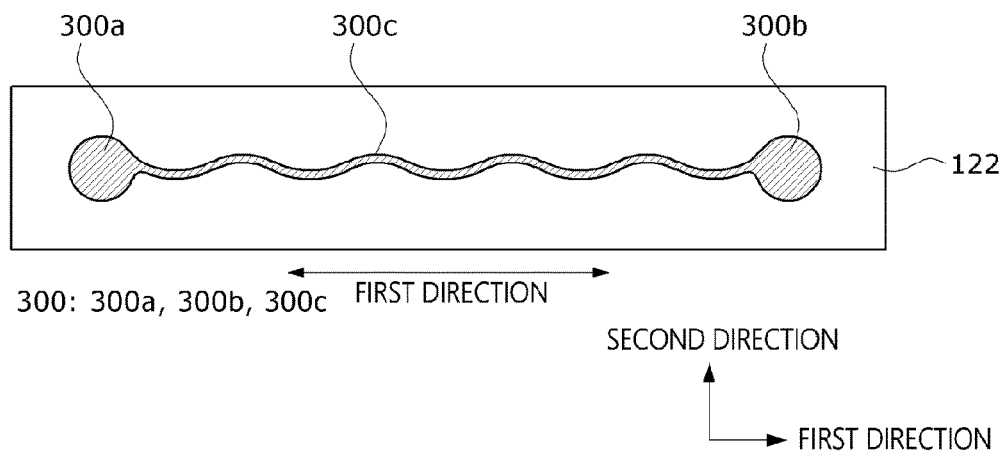
[Fig. 6]
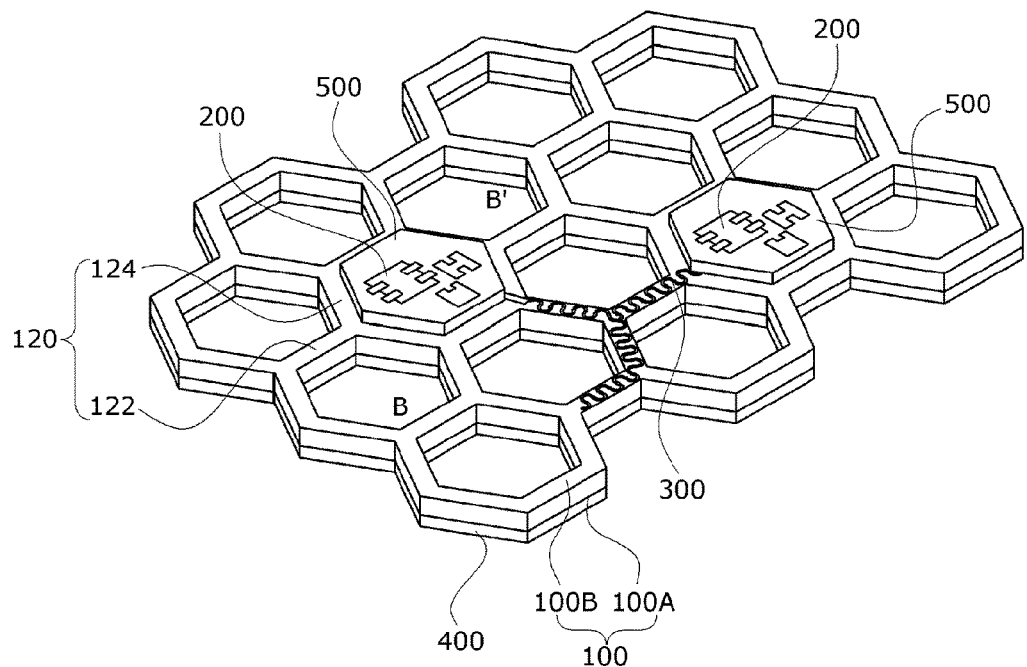

[Fig. 7]
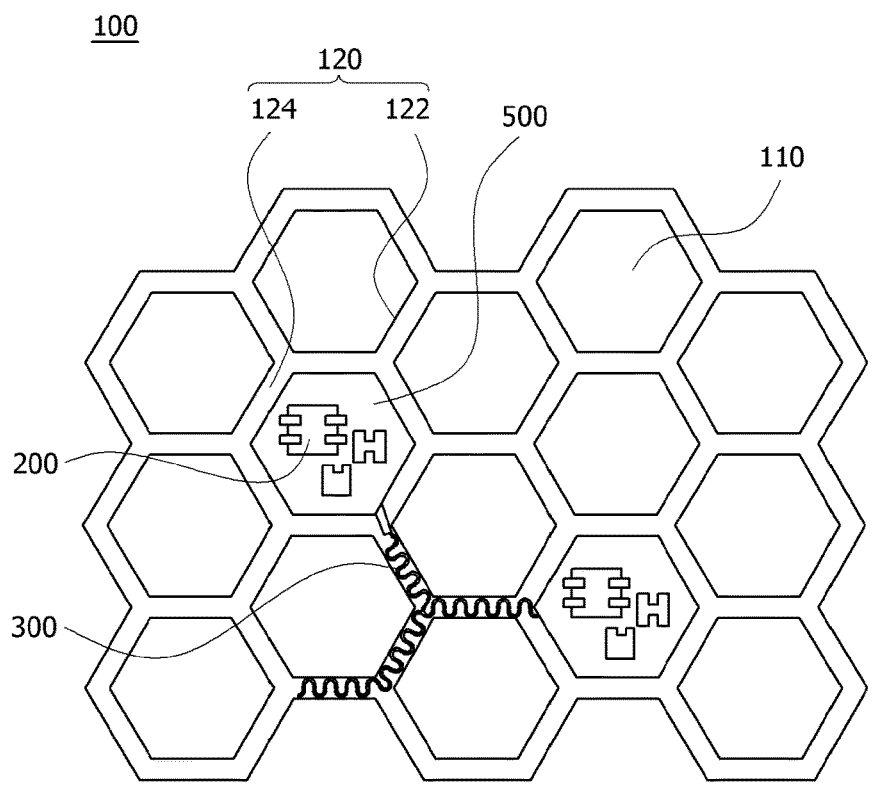
[Fig. 8]
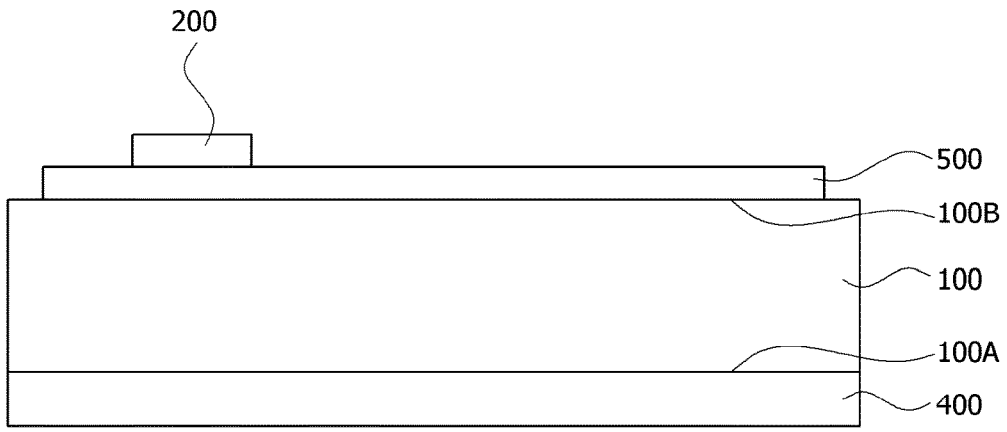
[Fig. 9]
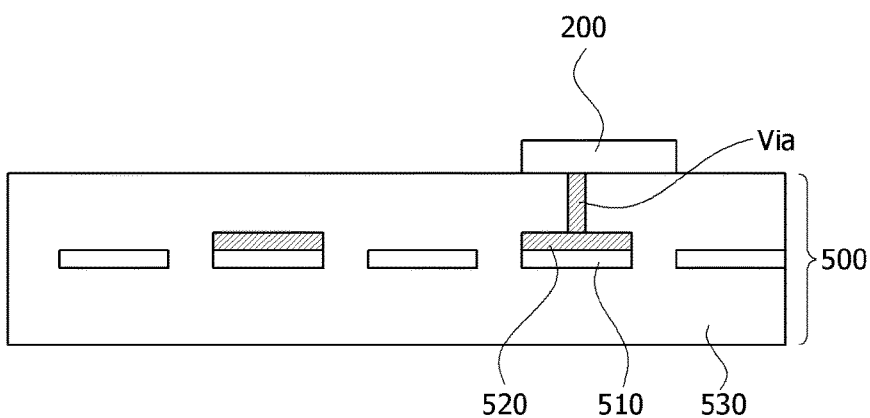

[Fig. 10]
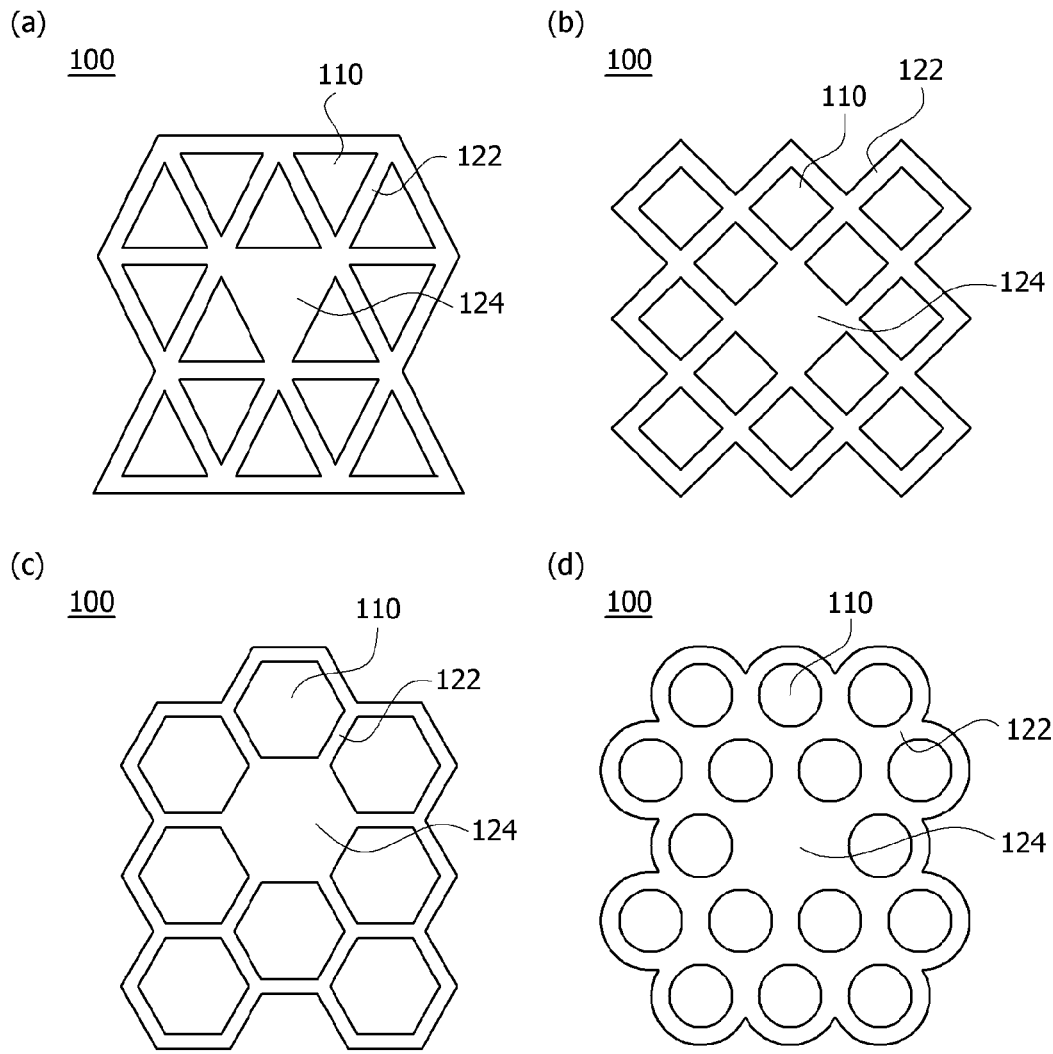
[Fig. 11]
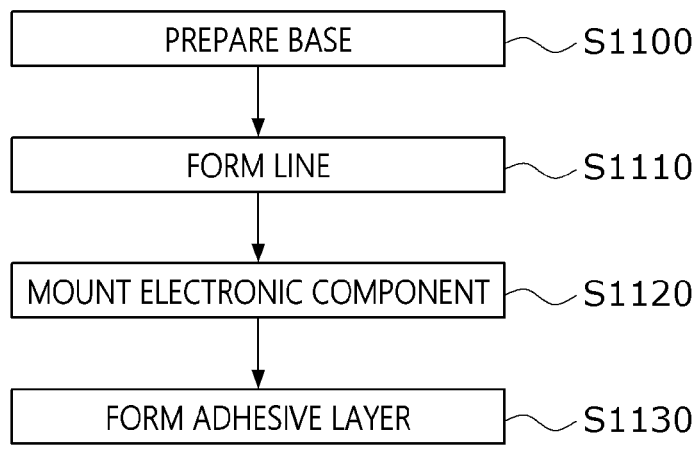

ELECTRONIC SUBSTRATE

CROSS REFERENCE TO RELATED APPLICATIONS

This application is the National Phase of PCT International Application No. PCT/KR2022/002763, filed on Feb. 25, 2022, which claims priority under 35 U.S.C. § 119(a) to Patent Application No. 10-2021-0026518, filed in the Republic of Korea on Feb. 26, 2021, all of which are hereby expressly incorporated by reference into the present application.

TECHNICAL FIELD

The present invention relates to an electronic substrate, and more particularly, to a stretchable electronic substrate.

BACKGROUND ART

Stretchable electronic substrates are next-generation electronic devices capable of operating without losing device characteristics even when a base is stretched or bent and maintaining the device characteristics even when an external force is removed. The stretchable electronic substrates may be attached to a curved surface such as a human body, and thus may be applied to a medical electronic patch, a wearable electronic patch, and the like.

In order to implement the stretchable electronic substrate, an elastically extendable base and a line and an electronic component that are disposed on the base are required. When the base is extended, the line disposed on the base may be disconnected, or the electronic component disposed on the base may be damaged. Thus, the durability and reliability of the stretchable electronic substrate may be lowered.

Meanwhile, when the stretchable electronic substrate is applied to a skin, the skin may be blocked from the air, and the skin may be damaged due to irritation when the attachment continues for a long time. In particular, when the stretchable electronic substrate is a medical electronic patch applied to a wound, air permeability is essentially required.

DISCLOSURE OF INVENTION

Technical Problem

The present invention is directed to providing a stretchable electronic substrate having air permeability.

Solution to Problem

One aspect of the present invention provides an electronic substrate including a base including a first surface and a second surface that is a surface opposite to the first surface, an electronic component disposed on the second surface of the base, and a line disposed on the second surface of the base and connected to the electronic component, wherein the base includes a frame region including a flexible material and a plurality of opening regions passing between the first surface and the second surface, and the electronic component and the line are disposed in the frame region.

The frame region may include an edge region disposed to surround the plurality of opening regions and an island region disposed between the plurality of opening regions, wherein the electronic component may be disposed in the island region, and the line may be disposed in the edge region.

The electronic substrate may further include an adhesive layer disposed on the first surface.

The flexible material may include at least one among a silicone-based elastomer, a urethane-based elastomer, a styrene-based elastomer, and an olefin-based elastomer.

The electronic component may include at least one among a sensor, a capacitor, a resistor, an inductor, a transistor, an antenna, a diode, a battery, and a communication module.

The electronic substrate may further include a flexible substrate disposed between the island region and the electronic component, wherein a Young's modulus of the flexible substrate may be greater than a Young's modulus of the island region.

The electronic substrate may further include a circuit pattern disposed on the flexible substrate and connected to the electronic component.

The flexible substrate may include at least one among polyethylene terephthalate (PET), polyimide (PI), polyethersulfone (PES), and polyethylent naphthalate (PEN).

The flexible substrate may include polymer layers, metal layers disposed on some of the polymer layers, and a molding layer configured to mold the polymer layers and the metal layers.

The molding layer may include polydimethylsiloxane (PDMS) or polyurethane.

A Young's modulus of the polymer layer may be greater than a Young's modulus of the molding layer.

The polymer layer may include a fiber mat or a mesh film.

A via may be formed in the molding layer to electrically connect the metal layer and the electronic component.

The plurality of opening regions may each have a circular or polygonal shape.

The line may have a curved shape that is repeated in a predetermined pattern.

The line may include a first pad, a second pad, and a connection part connecting the first pad and the second pad. The connection part may have a curved shape that is repeated in a predetermined pattern.

The line may include a flexible electrode including a flexible material and a metal.

A width of one of the plurality of opening regions may be greater than a width of the edge region and less than a width of the island region.

The width of the edge region may range from 10 μm to 1 mm.

The maximum width of one of the plurality of opening regions may range from 100 μm to 10 mm.

Advantageous Effects of Invention

According to an embodiment of the present invention, it is possible to obtain a stretchable electronic board having air permeability. In particular, according to the embodiment of the present invention, it is possible to obtain a stretchable electronic substrate having a low possibility of line disconnection and having high durability and reliability. Accordingly, the electronic substrate according to the embodiment of the present invention is not only stretchable but also can maintain mechanical and electrical properties even when deformed, such as when folded, bent, or twisted, and thus can be applied to an attachment site requiring a high strain.

BRIEF DESCRIPTION OF DRAWINGS

FIG. 1 is a perspective view of a stretchable electronic substrate according to one embodiment of the present invention.

FIG. 2 is a top view of the stretchable electronic substrate according to one embodiment of the present invention.

FIG. 3 is a cross-sectional view taken along direction A-A' in FIG. 1.

FIG. 4 is a top view of a base applied to the stretchable electronic substrate according to one embodiment of the present invention.

FIG. 5 illustrates a line included in the stretchable electronic substrate according to one embodiment of the present invention.

FIG. 6 is a perspective view of a stretchable electronic substrate according to another embodiment of the present invention.

FIG. 7 is a top view of the stretchable electronic substrate according to another embodiment of the present invention.

FIG. 8 is a cross-sectional view taken along direction B-B' in FIG. 6.

FIG. 9 is a cross-sectional view of a flexible substrate according to the embodiment of the present invention.

FIG. 10 illustrates various shapes of the base applied to the electronic substrate according to the embodiment of the present invention.

FIG. 11 is a flowchart illustrating a method of manufacturing the electronic substrate according to one embodiment of the present invention.

MODE FOR THE INVENTION

Hereinafter, exemplary embodiments of the present invention will be described in detail with reference to the accompanying drawings.

However, the technical spirit of the present invention is not limited to some embodiments that will be described and may be implemented in various forms, and one or more components in the embodiments may be selectively combined and replaced to be used within the scope of the technical spirit of the present invention.

Further, the terms used in the embodiments of the present invention (including technical and scientific terms), may be interpreted with meanings that are generally understood by those skilled in the art unless particularly defined and described, and terms which are generally used, such as terms defined in a dictionary, may be understood in consideration of their contextual meanings in the related art.

Further, the terms used in the embodiments of the present invention are provided only to describe embodiments of the present invention and not for purposes of limitation.

In the present specification, unless clearly indicated otherwise by the context, singular forms include the plural forms thereof, and in a case in which "at least one (or one or more) among A, B, and C" is described, this may include at least one com-bination among all combinations which can be combined with A, B, and C.

In addition, terms such as first, second, A, B, (a), (b), and the like may be used to describe components of the embodiments of the present invention.

These terms are only provided to distinguish the components from other components, and the essence, sequence, order, or the like of the components are not limited by the terms.

Further, when a component is described as being "connected," "coupled," or "linked" to another component, the component may include not only a case of being directly connected, coupled, or linked to another component but also a case of being connected, coupled, or linked to another device by still another component between the component and another component.

Further, when a component is described as being formed "on (above)" or "under (below)" another component, the term "on (above)" or "under (below)" includes both of a case in which two components are in direct contact with each other or a case in which one or more components are (indirectly) disposed between two components. In addition, when a component is described as being disposed "on or under" another component, such a description may include a case in which the device is disposed at an upper side or a lower side with respect to another component.

A stretchable electronic substrate according to an embodiment of the present invention is a device that may operate without losing device characteristics even when a base is stretched or bent and maintain the device characteristics even when an external force is removed, and may be interchangeably used with a stretchable electronic device, a flexible electronic device, and the like. The stretchable electronic substrate according to the embodiment of the present invention may be variously applied to a wearable electronic device, an electronic skin, a skin-attachable electronic device, an Internet of Things (IoT) device, an electronic device for a vehicle, an intelligent robot, a healthcare electronic device, a stretchable display, a stretchable solar cell, a stretchable battery/energy harvester, and the like.

As used herein, the term "stretch" may have flexible properties that are unbreakable, bendable, rollable, and folderable as well as stretchable properties. Accordingly, the base of the stretchable electronic substrate may be implemented as a curved surface, may be extended in at least one direction by an external force, and may be restored to an original state thereof when the external force is removed.

FIG. 1 is a perspective view of a stretchable electronic substrate according to one embodiment of the present invention, FIG. 2 is a top view of the stretchable electronic substrate according to one embodiment of the present invention, FIG. 3 is a cross-sectional view taken along direction A-A' in FIG. 1, and FIG. 4 is a top view of a base applied to the stretchable electronic substrate according to one embodiment of the present invention.

Referring to FIGS. 1 to 4, a stretchable electronic substrate 10 according to the embodiment of the present invention includes a base 100, an electronic component 200, and a line 300. Here, the electronic component 200 may include at least one of a sensor, a capacitor, a resistor, an inductor, a transistor, an antenna, a diode, a battery, a light-emitting diode (LED), and a communication module. Here, the sensor may include, for example, a temperature sensor, an acceleration sensor, an ultraviolet (UV) sensor, a pH sensor, a strain sensor, an electrochemical sensor, or the like.

Here, the base 100 includes a first surface 100A and a second surface 100B, which is a surface opposite to the first surface 100A, and the electronic component 200 is disposed on the second surface 100B of the base 100. In addition, the line 300 is disposed on the second surface 100B of the base 100 and connected to the electronic component 200.

Here, the base 100 may be bent by an external force or extended in at least one direction by an external force. That is, the base 100 may be a stretchable base, and the base, as used herein, may be interchangeably used with a flexible base, a soft base, a stretchable base, an elastic base, and the like. The base 100 may be restored to an original state thereof when the external force is removed.

According to the embodiment of the present invention, the base 100 may include a flexible material. Here, the flexible material may include a polymer resin having a predetermined elasticity. For example, the flexible material may include at least one among a silicone-based elastomer, a urethane-based elastomer, a styrene-based elastomer, and an olefin-based elastomer. For example, the flexible material may include one or more selected from among polydimethylsiloxane (PDMS), Silbione™ Ecoflex™, polyurethane (PU), styrene-butadiene rubber (SBR), styrene butadiene styrene rubber (SBS), styrene-ethylene-butylene-styrene rubber (SEBS), styrene-isoprene-styrene rubber (SIS), polyethylene-co-propylene elastomer (POE), and ethylene propylene diene rubber (EPDM), but the present invention is not limited thereto. The base 100 according to the embodiment of the present invention may be obtained by curing the flexible material.

Accordingly, the base 100 may be elastically stretched according to an external force.

According to the embodiment of the present invention, the base 100 includes a flexible material and a frame region 120 including a plurality of opening regions 110 passing between the first surface 100A and the second surface 100B, and the electronic component 200 and the line 300 are disposed in the frame region 120. Here, the opening region 110 may be a region in which the flexible material is not disposed, that is, a hole region, and the frame region 120 may be a region including the flexible material. Here, the plurality of opening regions 110 may have a predetermined pattern. For example, the plurality of opening regions 110 may have a plurality of circular shapes or a plurality of polygonal shapes. For example, the plurality of opening regions 110 may be honeycomb shaped. At this point, a width 110w of each of the opening regions 110 may range from 100 μm to 10 mm, preferably from 200 μm to 5 mm, and more preferably from 300 μm to 3 mm. Here, the width 110w of each opening region 110 may mean the maximum width of each opening region 110. Accordingly, when the electronic substrate 10 according to the embodiment of the present invention is attached to a skin, skin irritation may be minimized because air permeability is ensured, and the electronic substrate 10 may be stretched in various directions and lengths regardless of a curvature of the attached surface, and may also be attached to the part (e.g., an elbow) in which a high strain is required.

Meanwhile, according to the embodiment of the present invention, the frame region 120 may include an edge region 122 disposed to surround the plurality of opening regions 110 and island regions 124 each disposed between the plurality of opening regions 110, the electronic component 200 may be disposed in the island region 124, and the line 300 may be disposed in the edge region 122. In this case, the island regions 124 may be in a form in which some of the plurality of opening regions 110 are filled with a flexible material. That is, the island region 124 is a region in which the opening region 110 is not formed. At this point, the width 110w of each opening region 110 may be greater than a width 122w of the edge region 122 and may be less than a width 124w of the island region 124. For example, the width 122w of the edge region 122 may range from 10 μm to 1 mm, and preferably from 100 μm to 1 mm. In addition, the edge region 122 and the island region 124 may be integrally formed.

Accordingly, when the base 100 is stretched, the island region 124 may be extended relatively less than the edge region 122. That is, since a tensile stress is concentrated on the edge region 122, when the base 100 is stretched, a relatively small tensile stress may be applied to the island region 124.

According to the embodiment of the present invention, when the electronic component 200 is disposed in the island region 124, a stress applied to the electronic component 200 may be minimized so that the electronic component 200 may be electrically stable.

In addition, according to the embodiment of the present invention, when the line 300 is disposed in the edge region 122, since a portion of the tensile stress is absorbed by the edge region 122 when the base 100 is stretched, the tensile stress applied directly to the line 300 may be reduced, and accordingly, the problem that the line 300 is disconnected may be minimized.

Meanwhile, according to the embodiment of the present invention, the line 300 may have a straight line or a curved shape in which a predetermined pattern is repeated. More specifically, as shown in FIG. 5, the line 300 may include a first pad 300a, a second pad 300b, and a connection part 300c connecting the first pad 300a and the second pad 300b.

At this point, the first pad 300a and the second pad 300b may be made of the same material as the connection part 300c, or may be made of a material that is different from that of the connection part 300c but has conductivity. The first pad 300a and the second pad 300b may be connected to a device disposed on the first pad 300a and the second pad 300b, or may be connected to vias. The connection part 300c may include a repeating curved pattern. For example, the repeating curved pattern may be a meanderingly bent pattern or the like. For example, the connection part 300c may have a plurality of pattern shapes 300c1, 300c2, and 300c3, which are repeatedly connected along a first direction, and each pattern may have a shape connected with a predetermined curvature along a second direction crossing the first direction. Here, an inner angle between the first and second directions may range from 1° to 90°, preferably from 10° to 90°, more preferably from 20° to 90°, still more preferably from 30° to 90°, and yet more preferably from 45° to 90°. Accordingly, as shown in FIG. 5B, when an external force for pulling the base 100 in the first direction is applied, the connection part 300c may not be disconnected and may be extended in the direction, in which the external force is applied, together with the base 100.

Accordingly, the line 300 may also be extended as the edge region 122 is stretched, thereby reducing the possibility of disconnection of the line 300.

At this point, the line 300 may include a flexible electrode including a flexible material and a metal. Here, the flexible material may include a polymer resin having a predetermined elasticity, and the metal may include a conductive metal such as copper, gold, silver, nickel, and the like. Alternatively, the line 300 may also include a liquid metal such as eutectic gallium indium (eGaIn), aluminum gallium arsenide (GaInSn), or the like. Accordingly, since the line 300 is also stretchable, the line 300 may also be extended along the stretch of the edge region 122.

In addition, according to one embodiment of the present invention, an adhesive layer 400 may be disposed on the first surface 100A of the base 100. Accordingly, the electronic substrate 10 according to the embodiment of the present invention may be directly attached to an attachment surface such as a skin. As in the embodiment of the present invention, when the base 100 includes the plurality of opening regions 110, the adhesive layer 400 may be applied only to the frame region 120, so that an area in which the adhesive layer 400 and the skin are in contact with each other may be minimized, thereby minimizing irritation applied to the skin.

FIG. 6 is a perspective view of a stretchable electronic substrate according to another embodiment of the present invention, FIG. 7 is a top view of the stretchable electronic substrate according to another embodiment of the present invention, and FIG. 8 is a cross-sectional view taken along direction B-B' in FIG. 6. Redundant descriptions of the same contents as those described with reference to FIGS. 1 to 5 will be omitted.

Referring to FIGS. 6 to 8, a flexible substrate 500 may further be disposed between an island region 124 and an electronic component 200. Here, a Young's modulus of the flexible substrate 500 may be greater than a Young's modulus of the island region 124. Here, the Young's modulus is a coefficient indicating a degree to which an object having elasticity changes in relative length for a stress, and is also referred to as an elastic modulus. The Young's modulus is proportional to the force applied to the object and inversely proportional to a strain in a length direction. Accordingly, when the same force is applied to the flexible substrate 500 and the island region 124, a strain of the flexible substrate 500 may be less than that of the island region 124. In the present specification, the stress may be used interchangeably with an external force and the like, and the strain may be used interchangeably with stretching and the like.

For example, the flexible substrate 500 may include at least one among polyethylene terephthalate (PET), polyimide (PI), polyethersulfone (PES), and polyethylent naphthalate (PEN). As such, when the flexible substrate 500 having a Young's modulus greater than that of the island region 124 is disposed in the island region 124, and the electronic component 200 is disposed on the flexible substrate 500, a tensile stress is concentrated on the island region 124 having a relatively low Young's modulus, and the flexible substrate 500 having a relatively high Young's modulus is not deformed. Accordingly, the stress applied to the electronic component 200 disposed on the flexible substrate 500 may be minimized, and the electronic component 200 may be stably driven.

Meanwhile, according to the embodiment of the present invention, the flexible substrate 500 may include a circuit pattern, and the circuit pattern may be connected to the electronic component 200 disposed on the flexible substrate 500. FIG. 9 is a cross-sectional view of the flexible substrate 500 according to the embodiment of the present invention.

Referring to FIG. 9, the flexible substrate 500 includes polymer layers 510, metal layers 520 disposed on some of the polymer layers 510, and a molding layer 530 configured to mold the polymer layers 510 and the metal layers 520.

Here, the molding layer 530 may be an elastic base including silicon (Si). For example, the molding layer 530 may include polydimethylsiloxane (PDMS). Alternatively, the molding layer 530 may include polyurethane.

A Young's modulus of the polymer layer 510 may be greater than a Young's modulus of the molding layer 530. To this end, the polymer layer 510 may include a fiber mat or mesh film having a higher Young's modulus than the molding layer 530. Here, at least one of the fiber mat and the mesh film may include at least one of polyimide (PI) and polyethyleneterephthalate (PET).

Meanwhile, according to the embodiment of the present invention, the metal layers 520 may be disposed on some of the polymer layers 510. The metal layer 520 may include at least one among gold (Au), copper (Cu), platinum (Pt), and silver (Ag), and may serve as a circuit pattern. To this end, the metal layer 520 may be patterned in a shape of a pad and a connection part on the polymer layer 510, as described with reference to FIG. 5. To this end, the metal layer 520 and the polymer layer 510 may be patterned together.

The metal layer 520 has a high adhesive strength with the polymer layer 510 as compared with the molding layer 530. Accordingly, the metal layer 520 may be bonded to the molding layer 530 through the polymer layer 510.

Further, in the case in which the metal layer 520 is disposed on the polymer layer 510 having a higher Young's modulus than the molding layer 530, even when an external force is applied to the molding layer 530, the possibility that the metal layer 520 is disconnected may be reduced because the metal layer 520 is stretched together with the polymer layer 510 due to the Young's modulus of the polymer layer 510.

At this point, the metal layers 520 are disposed on some of the polymer layers 510. That is, the polymer layers 510 includes a first region having both surfaces on which the molding layer 530 is disposed, and a second region having both surfaces, which has one surface on which the molding layer 530 is disposed and the other surface on which the metal layer 520 is disposed. In the present specification, the first region may be referred to as a stretch control region, and the second region may be referred to as a circuit line region. Accordingly, a portion of the polymer layer 510 may serve to bond the metal layer 520 and the molding layer 530 and control the stretch of the molding layer 530, and another portion of the polymer layer 510 may serve to control the stretch of the molding layer 530.

As illustrated in the drawing, the metal layer 520 may be connected to the electronic component 200 disposed on a surface of the flexible substrate 500. To this end, a via may be formed in the molding layer 530 to electrically connect the metal layer 520 and the electronic component 200. The metal layer 520 may be at least a portion of the line 300.

Here, although the metal layer 520 is illustrated as being disposed on the polymer layer 510, the present invention is not limited thereto, and the metal layer 520 may be disposed alone in the molding layer 530. The metal layer 520 may serve as a circuit pattern, which may be directly or indirectly connected between a skin and the electronic component 200, and when a plurality of electronic component 200 are disposed on the flexible substrate 500, the metal layer 520 may electrically connect between the electronic components 200.

Although not illustrated in the drawing, the electronic component 200 may be molded on an upper surface of the frame region 120 together with the line 300. For example, the electronic component 200 may be molded by silicon together with the line 300. Accordingly, the electronic component 200 and the line 300 may be protected from external stimuli such as moisture, dust, and the like.

Meanwhile, in the above, the electronic board of a single layer has been described as an example, but the embodiment of the present invention is not limited thereto. The stretchable electronic board according to the embodiment of the present invention may be formed of multiple layers.

In the above, the base 100 has been described as having a honeycomb shape as an example, but the present invention is not limited thereto.

FIG. 10 illustrates various shapes of the base applied to the electronic substrate according to the embodiment of the present invention.

Referring to FIG. 10A, the plurality of opening regions 110 formed in the base 100 may each have a triangular shape, and the island region 124 may also have a triangular shape the same as that of the opening region 110.

Alternatively, referring to FIG. 10B, the plurality of opening regions 110 formed in the base 100 may each have a quadrangular shape, and the island region 124 may also have a quadrangular shape the same as that of the opening region 110.

Alternatively, referring to FIG. 10C, the plurality of opening regions 110 formed in the base 100 may each have a hexagonal shape, and the island region 124 may also have a hexagonal shape the same as that of the opening region 110.

Alternatively, referring to FIG. 10D, the plurality of opening regions 110 formed in the base 100 may each have a circular shape.

In these cases, all of the plurality of opening regions 110 formed in one base 100 may have the same shape and size. Accordingly, manufacturing may be easily performed, and in addition, the entire region of the base 100 may have uniform air permeability.

In particular, in the case in which the opening region 110 has a circular shape or a polygonal shape of hexagon or higher polygon, even when tensile stresses with various strengths are applied to the base 100 in various directions, force may be distributed in a balanced manner, and thus a problem that the base 100 is deformed or twisted may be prevented.

FIG. 11 is a flowchart illustrating a method of manufacturing the electronic substrate according to one embodiment of the present invention.

Referring to FIG. 11, a base 100 according to the embodiment of the present invention is prepared (S1100). As an example, the base 100 may be manufactured by a method of filling a flexible material in a liquid state into a metal mold having a honeycomb- or circular-shaped column, curing the flexible material using heat or UV, and separating the cured flexible material from the metal mold. As another example, the base 100 may be manufactured by a method of pressing a flexible material sheet with a punch having a honeycomb- or circular-shaped column. As still another example, the base 100 may be manufactured by a method of selectively curing a UV light curable flexible material (e.g., PDMS) through a honeycomb- or circular-shaped photomask. As yet another example, the base 100 may be manufactured by a method of masking a flexible material sheet using a metal or a photoresist, and then etching. At this point, a metal mold, the punch, the photomask, or the photoresist may be manufactured so that a region corresponding to an island region 124 is not open. Alternatively, a plurality of opening regions may be formed in a uniform pattern using the metal mold, the punch, the photomask, or the photoresist, and then, an opening corresponding to the island region 124 may be filled with a flexible material and cured.

Next, a line 300 is formed on the base 100 (S1110). As described above, the line 300 may be formed to extend along an edge region 122 of the base 100. At this point, the line 300 may be formed by a method of dispensing or spraying a mixture of a flexible material and a metal powder.

Next, an electronic component 200 is mounted on the base 100 and connected to the line 300 (S1120). As described above, the electronic component 200 may be disposed in the island region 124 of the base 100. At this point, the electronic component 200 may be disposed directly in the island region 124, or may be disposed in the island region 124 through a flexible substrate 500. In this case, the electronic component 200 may be adhered to the island region 124 through an adhesive.

Next, an adhesive layer 400 is formed on one surface of both surfaces of the base 100, which is a surface opposite a surface thereof on which the electronic component 200 and the line 300 are formed (S1130). Here, the adhesive layer 400 may include an adhesive material, and may include, for example, Silbione™, Ecoflex™, or the like.

The electronic substrate according to the embodiment of the present invention may be applied to a medical electronic patch, a wearable electronic patch, or the like. For example, the electronic substrate according to the embodiment of the present invention may be applied to a wound site that requires ventilation, and may be used for monitoring a wound healing state.

Although the exemplary embodiments of the present invention have been described above, it may be understood by those skilled in the art that a variety of modifications and changes may be made without departing from the concept and scope of the present invention disclosed within the range of the following claims.

DESCRIPTION OF REFERENCE NUMERALS

10: electronic substrate
100: base
110: opening region
120: frame region
122: edge region
124: island region
200: electronic component
300: line
400: adhesive layer
500: flexible substrate

The invention claimed is:

1. An electronic substrate comprising:
a base including a first surface and a second surface that is a surface opposite to the first surface;
an electronic component disposed on the second surface of the base;
a line disposed on the second surface of the base and connected to the electronic component, and
a flexible substrate,
wherein
the base includes a frame region including a flexible material and a plurality of opening regions passing between the first surface and the second surface,
the electronic component and the line are disposed in the frame region,
the frame region includes an edge region disposed to surround the plurality of opening regions and an island region disposed between the plurality of opening regions,
the electronic component is disposed in the island region,
the line is disposed in the edge region, and
the flexible substrate is disposed between the island region and the electronic component.

2. The electronic substrate of claim 1, further comprising an adhesive layer disposed on the first surface.

3. The electronic substrate of claim 1, wherein the flexible material includes at least one among a silicone-based elastomer, a urethane-based elastomer, a styrene-based elastomer, and an olefin-based elastomer.

4. The electronic substrate of claim 1, wherein the electronic component includes at least one among a sensor, a capacitor, a resistor, an inductor, a transistor, an antenna, a diode, a battery, and a communication module.

5. The electronic substrate of claim 1, wherein a Young's modulus of the flexible substrate is greater than a Young's modulus of the island region.

6. The electronic substrate of claim 1, further comprising a circuit pattern disposed on the flexible substrate and connected to the electronic component.

7. The electronic substrate of claim 1, wherein the flexible substrate includes at least one among polyethylene terephthalate (PET), polyimide (PI), polyethersulfone (PES), and polyethylent naphthalate (PEN).

8. The electronic substrate of claim 1, wherein the flexible substrate includes polymer layers, metal layers disposed on some of the polymer layers, and a molding layer to mold the polymer layers and the metal layers.

9. The electronic substrate of claim 8, wherein the molding layer includes polydimethylsiloxane (PDMS) or polyurethane.

10. The electronic substrate of claim 8, wherein a Young's modulus of the polymer layer is greater than a Young's modulus of the molding layer.

11. The electronic substrate of claim 8, wherein the polymer layer includes a fiber mat or a mesh film.

12. The electronic substrate of claim 8, wherein a via is formed in the molding layer to electrically connect the metal layer and the electronic component.

13. The electronic substrate of claim 1, wherein the line includes a flexible electrode including a flexible material and a metal.

14. The electronic substrate of claim 1, wherein a width of one of the plurality of opening regions is greater than a width of the edge region and is less than a width of the island region.

15. The electronic substrate of claim 14, wherein a width of the edge region ranges from 10 μm to 1 mm.

16. The electronic substrate of claim 1, wherein a maximum width of one of the plurality of opening regions ranges from 100 μm to 10 mm.

17. An electronic substrate comprising:
a base including a first surface and a second surface that is a surface opposite to the first surface;
an electronic component disposed on the second surface of the base; and
a line disposed on the second surface of the base and connected to the electronic component,
wherein
the base includes a frame region including a flexible material and a plurality of opening regions passing between the first surface and the second surface,
the electronic component and the line are disposed in the frame region, and
the line has a curved shape that is repeated in a predetermined pattern.

18. An electronic substrate comprising:
a base including a first surface and a second surface that is a surface opposite to the first surface;
an electronic component disposed on the second surface of the base; and
a line disposed on the second surface of the base and connected to the electronic component,
wherein
the base includes a frame region including a flexible material and a plurality of opening regions passing between the first surface and the second surface,
the electronic component and the line are disposed in the frame region, and
the line includes a first pad, a second pad, and a connection part connecting the first pad and the second pad, and the connection part has a curved shape that is repeated in a predetermined pattern.

* * * * *